United States Patent
Zeng et al.

(10) Patent No.: US 10,950,596 B2
(45) Date of Patent: Mar. 16, 2021

(54) DIODE WITH CURRENT SENSOR

(71) Applicant: SEMICONDUCTOR COMPONENTS INDUSTRIES, LLC, Phoenix, AZ (US)

(72) Inventors: Xiang Zeng, Wuxi (CN); Xiaoli Wu, Shanghai (CN); Hao Wang, Shanghai (CN); Thomas Neyer, Munich (DE); Hocheol Jang, Bucheon (KR); Sungkyu Song, Bucheon (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 204 days.

(21) Appl. No.: 16/150,836

(22) Filed: Oct. 3, 2018

(65) Prior Publication Data

US 2020/0111776 A1    Apr. 9, 2020

(51) Int. Cl.

| | | |
|---|---|---|
| *H01L 27/02* | (2006.01) | |
| *H01L 29/06* | (2006.01) | |
| *G01R 15/14* | (2006.01) | |
| *G01R 19/00* | (2006.01) | |
| *H01L 29/861* | (2006.01) | |
| *H01L 29/739* | (2006.01) | |
| *G05F 1/573* | (2006.01) | |
| *H03K 17/14* | (2006.01) | |

(52) U.S. Cl.
CPC ........ *H01L 27/0248* (2013.01); *G01R 15/146* (2013.01); *G01R 19/0092* (2013.01); *G05F 1/573* (2013.01); *H01L 29/0619* (2013.01); *H01L 29/7397* (2013.01); *H01L 29/861* (2013.01); *H03K 17/14* (2013.01)

(58) Field of Classification Search
CPC ............. H01L 27/0248; H01L 29/0619; H01L 29/7397; H01L 29/861; H01L 29/0692; H01L 29/868; H01L 29/417; H01L 29/402; H01L 29/404; G01R 15/146; G01R 19/0092; G05F 1/573; H03K 17/14
See application file for complete search history.

(56) References Cited

U.S. PATENT DOCUMENTS

| | | | |
|---|---|---|---|
| 6,180,966 B1 | 1/2001 | Kohno et al. | |
| 6,906,362 B2 | 6/2005 | Yedinak et al. | |
| 7,390,115 B1* | 6/2008 | Huang ................... | H05B 45/00 362/542 |
| 2004/0080308 A1 | 4/2004 | Goto | |
| 2005/0158979 A1* | 7/2005 | Momota ........... | H01L 29/66136 438/614 |
| 2009/0057832 A1* | 3/2009 | Kouno ................ | H01L 27/0255 257/577 |

(Continued)

*Primary Examiner* — Tung X Nguyen
*Assistant Examiner* — Feba Pothen
(74) *Attorney, Agent, or Firm* — Brake Hughes Bellermann LLP (57) ABSTRACT

A diode with a current sensor is disclosed. The diode includes an anode region, a cathode region, and a channel-stop region. The diode further includes a sense resistor that is connected between the channel-stop region and the cathode region. When the diode is forward biased, a sense current flows through the sense resistor that corresponds to the forward current flowing through the diode. When the diode is reverse biased, the channel-stop region helps prevent a breakdown condition in the diode.

20 Claims, 10 Drawing Sheets

(56) References Cited

U.S. PATENT DOCUMENTS

| | | | | |
|---|---|---|---|---|
| 2010/0117725 A1* | 5/2010 | Mauder | ............... | H01L 27/0676 |
| | | | | 327/587 |
| 2011/0084620 A1* | 4/2011 | Lee | ........................ | H05B 45/10 |
| | | | | 315/186 |
| 2013/0020879 A1* | 1/2013 | Kihara | ................. | H04B 5/0037 |
| | | | | 307/104 |
| 2019/0109242 A1* | 4/2019 | Ramu | ................. | H01L 29/0692 |

* cited by examiner

DIODE WITH CURRENT SENSOR

FIELD OF THE DISCLOSURE

The present disclosure relates to power electronics and more specifically to a current sensor for accurately sensing the current through a diode.

BACKGROUND

Power electronics may be susceptible to fault conditions (e.g., overcurrent, short circuit, etc.). If a fault condition is not accurately detected and mitigated quickly (e.g., 1-10 microseconds), damage can result. Accordingly, new devices and techniques are needed for sensing conditions in power electronics.

SUMMARY

In one general aspect, the present disclosure describes a diode. The diode includes a substrate. A cathode pad is disposed on a bottom surface of the substrate. An anode pad is disposed on a first portion of a top surface (i.e., opposite to bottom surface) of the substrate, while a channel-stop pad is disposed on a second portion of the top surface. The diode further includes a sense resistor connected between the channel-stop pad and the cathode pad. The sense resistor is connected between the cathode pad and the channel-stop pad.

The sense resistor can be used to determine a forward current through the diode. Accordingly, in another general aspect, the present disclosure describes a method for determining a forward current through a diode. The method includes attaching a sense resistor between a cathode pad and a channel-stop pad of the diode. The method further includes applying a forward voltage between an anode pad of the diode and the cathode pad to forward bias the diode. A sense current is then measured through the sense resistor, and based on the measurement, the forward current through the diode is determined.

Measurement of the forward current through the diode be used in systems (e.g., power electronics systems) to sense (i.e., monitor) circuit conditions. Accordingly, in another general aspect the present disclosure describes a power electronics system. The power electronics system includes an inductor that is coupled to a switching device. When the switching device is in an ON state the inductor is charged, and when the switching device is in an OFF state, the inductor discharged. The power electronics system includes a diode that is coupled to the inductor that conducts a forward current when the inductor is discharged. The diode includes a sense resistor that is connected between a cathode pad and a channel-stop pad of the diode. The sense resistor is coupled to a monitoring circuit that is configured to measure the current discharged through the diode based on a sense voltage across the sense resistor.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

The present disclosure describes a diode that is configured with a conductive pad on a channel stop region of a substrate (i.e., a channel-stop pad). A sense resistor ($R_{SENSE}$) can be coupled to the diode between the channel-stop pad and the cathode pad of the diode so that a sense current ($I_{SENSE}$) flows through the sense resistor when the diode is forward biased. Then, by measuring $I_{SENSE}$ (or a sense voltage, $V_{SENSE}$), a forward current ($I_F$) through the diode may be estimated. Because the sense resistor is connected between the channel-stop pad and the cathode pad (e.g., ground), the voltage (and current) at the main (PN) junction of the diode is relatively unaffected by the measurement. Accordingly, the estimate of $I_F$ can be very accurate over a wide range of operating conditions (e.g., a wide range of $I_F$).

Figure 1A:
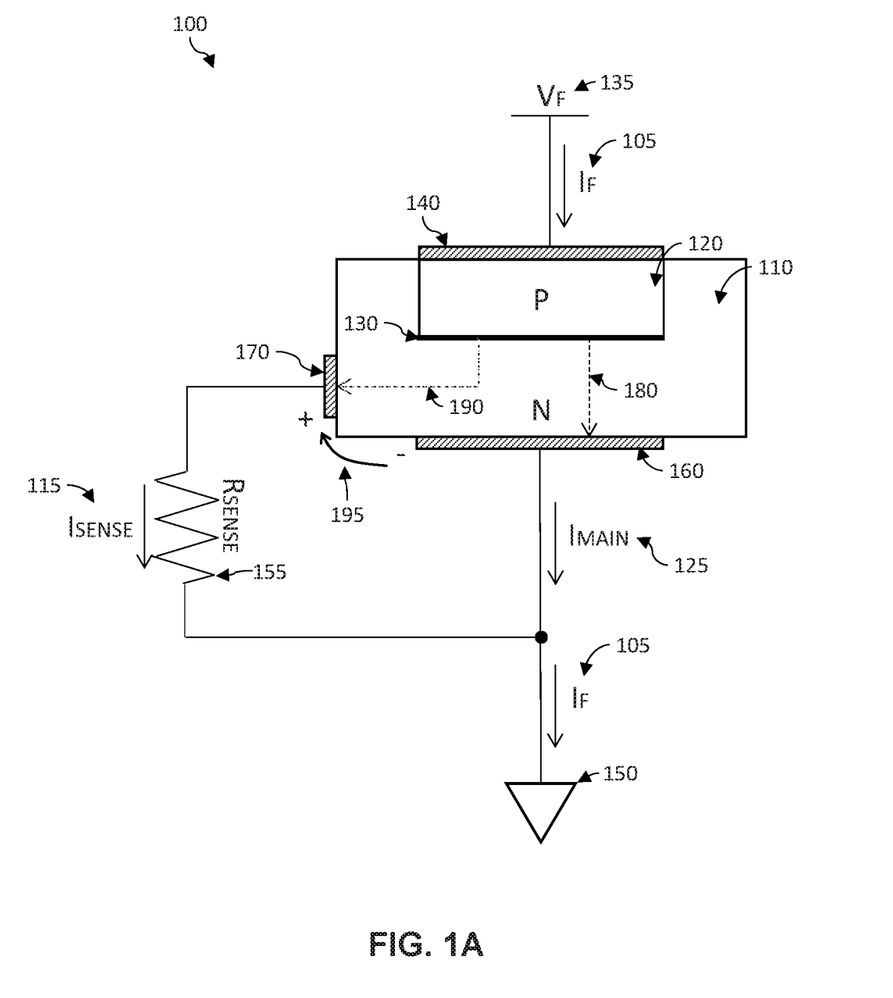
FIG. 1A is a block diagram of an example of a diode with a current sensor configured after the main PN junction of the diode.

FIG. 1A graphically illustrates an example of a diode with a current sensor 100 according to an embodiment of the present disclosure. The diode includes a substrate (e.g., silicon) that is doped with a material (e.g., phosphorus, arsenic, antimony, bismuth) to define (e.g., make) an N-type cathode region 110, and that is doped with a material (e.g., boron, aluminum, gallium, indium) to define (e.g., make) a P-type anode region 120. The main junction 130 at the boundary between the P-type and N-type materials may be forward biased by a forward voltage ($V_F$) 135 applied to a conductive pad disposed (e.g., plated) contiguous (e.g., directly coupled) to the anode region (i.e., an anode pad 140), and a voltage lower than $V_F$ (e.g., zero volts, ground 150) applied to a conductive pad disposed (e.g., plated) contiguous (e.g., directly coupled) to the cathode region (i.e., a cathode pad 160). When forward biased (e.g., by $V_F$) the diode conducts a forward current $I_F$ 105. In some implementations, the conductive pad disposed on the anode region and/or the cathode region can each be a metal layer.

The diode, shown in FIG. 1A, is configured to measure the forward current $I_F$ through the use of a sense resistor, $R_{SENSE}$ 155. When a forward voltage $V_F$ 135 is applied between the anode pad 140 and the cathode pad 160 of the diode 100, a forward current, $I_F$ 105, flows into the diode and across the main (PN) junction 130 of the diode. In the N-doped region 110 of the diode a sense pad 170 is used to couple a portion of the forward current into $R_{SENSE}$. In other words, after the main junction 130, carriers of $I_F$ may follow one of two different current paths: a first path 180 that is between the anode pad 140 and the cathode pad 160 and a second path 190 that is between the anode pad 140 and the sense pad 170. The amount of current that follows each path is determined by the path's resistance. For example, depending on the resistance of $R_{SENSE}$, some amount of $I_{SENSE}$ 115 is sampled from $I_F$ 105. The remaining current, $I_{MAIN}$, 125 is conducted via the cathode pad 160 to ground 150. Because $R_{SENSE}$ 155 is connected between the sense pad 170 and the cathode pad 160, the current $I_F$ 105 eventually flows to ground 150.

The sense current, $I_{SENSE}$, may be thought of as a sample of $I_F$ after $I_F$ has passed through the main junction 130. $I_{SENSE}$ can be determined by direct measurement (e.g., current probe) or by a measurement of the voltage, $V_{SENSE}$, across $R_{SENSE}$ (i.e., $I_{SENSE}=V_{SENSE}/R_{SENSE}$). The sense current $I_{SENSE}$, flowing into the sense resistor does not affect the voltage and/or current of the main (PN) junction 130 because $I_F$ is divided after crossing the main (PN) junction 130. In other words, $R_{SENSE}$ is positioned (e.g., electrically positioned) after the main (PN) junction 130 relative to the direction of the flow of the forward current, $I_F$. Likewise, the sense voltage, $V_{SENSE}$, across the sense resistor does not affect the voltage and/or current of the main (PN) junction 130 because the voltage across the span of the main (PN) junction is substantially constant (i.e., $V_F$). In other words, the main (PN) junction 130 is not de-biased (i.e., does not have voltage that varies across the span of the junction) by the $R_{SENSE}$ because the sense voltage 195 induced across $R_{SENSE}$ occurs between the cathode pad 160 and the sense pad 170, which are physically remote (e.g., separated) from the main (PN) junction. Additionally, as will be described below, the sense pad 170 may be integrated with features used in diodes for other purposes, thereby adding functionality without adding significant complexity.

Figure 1B:
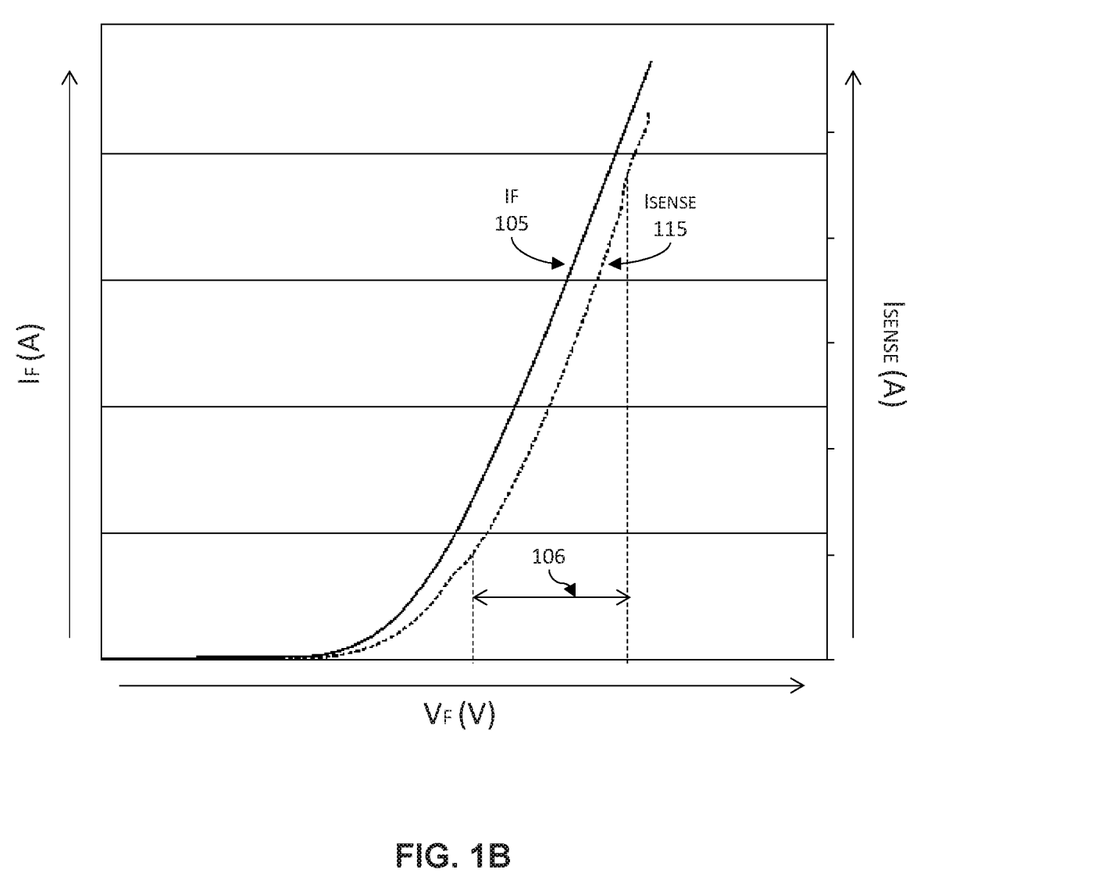
FIG. 1B is a graph of current versus voltage of a sensed current and a forward current for the current sensor configuration of FIG. 1A.

FIG. 1B is a graph showing the I-V characteristics of a diode with current sensor (e.g., $R_{SENSE}$) configured after the main junction (see FIG. 1A). In the graph, $I_{SENSE}$ 115 is approximately linearly related (e.g., proportional) to $I_F$ 105. For example, as $V_F$ can vary in a range of 0 to 2 volts, $I_F$ can vary from 0 to 250 amps according to the I-V characteristics of the main (PN) junction. $I_{SENSE}$ can be related to $I_F$ by a sense ratio of $I_F/I_{SENSE}$ in a range of 100-500. In some implementations, the sense ratio can be constant or relatively constant such that the curves 105, 115 are aligned over a relatively wide operating range 106 of voltage $V_F$, as shown in FIG. 1B. Accordingly, $I_{SENSE}$ may vary over a range from 0 to 0.6 amps as $I_F$ varies of the range of 0 to 250 amps. The sense ratio is based on the resistance of the second path 190 as compared to the first path 180. In practice, the sense ratio may be controlled by adjusting $R_{SENSE}$ and, as mentioned, may be in a range of about (e.g., within 10% of) 100 to 500. At least one advantage of a diode current sensor configured (e.g., arranged) after the main junction 130 is the control and versatility of the sensing ratio. One reason for this is that the resistance of $R_{SENSE}$ imposes a voltage 195 between the cathode pad 160 and the sense pad 170, and this voltage does not significantly de-bias the main junction 130.

The principles and techniques described thus far may be used to sense current through a semiconductor (PN) junction. While diode devices are considered, in theory the present disclosure is not limited to these devices but rather includes all devices with a semiconductor junction. In addition, based on the material and fabrication (e.g., doping) techniques, diode variations are available (e.g., fast recovery, soft recovery, Schottkey, Zener, signal diode, power diode, etc.). The present disclosure, and principles described herein, may be applied to all such diode variations.

Figure 2A:
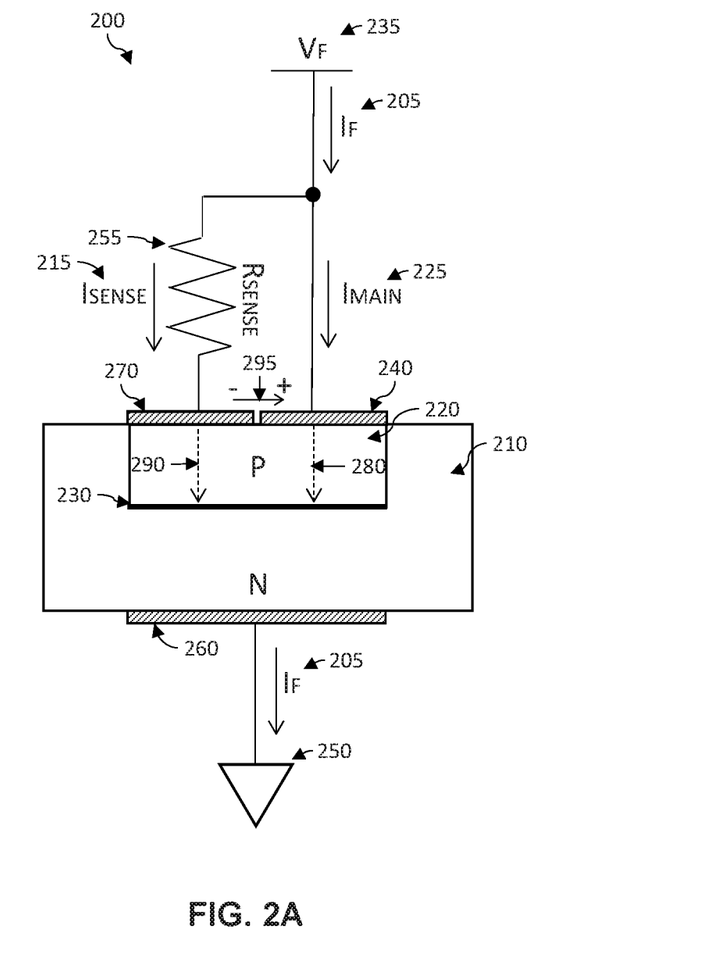
FIG. 2A is a block diagram of an example of a diode with a current sensor configured before the main PN junction of the diode.

For comparison, and as an illustration of a variation, an alternate diode with a current sensor embodiment is shown in FIG. 2A. Like the embodiment of FIG. 1A, the diode with a current sensor 200 includes a substrate with a P-type region 220 and an N-type region 210 that define (e.g., form) a main (PN) junction 230 at a boundary therebetween. A cathode pad (i.e., electrode) 260 is disposed on the N-type region 210, while an anode pad 240 is disposed on the P-type region.

Unlike the embodiment of FIG. 1A, a sense pad 270 is disposed on the P-type material 220 for the embodiment shown in FIG. 2A. While the sense pad may be integrated with a standard diode design (e.g., a portion the anode pad is electrically isolated on the substrate), dividing the anode pad in this way may negatively affect the operation of the diode. For example, a reduction of the anode pad area (i.e., a reduction in carrier injection efficiency) may ultimately affect the range of currents over which the diode may be operated.

As shown in FIG. 2A, a sense resistor 255 is connected between the anode pad 240 and the sense pad 270 to sense a forward current, $I_F$, 205 through the diode 200 when the diode is forward biased by a forward voltage, $V_F$, 235 connected between the anode pad 240 and the cathode pad 260. As shown and described herein, the current sensor (e.g., $R_{SENSE}$) for the embodiment of FIG. 2A is configured before the main PN junction 230 of the diode. Thus, the division of the current into two components (i.e., $I_{SENSE}$, $I_{MAIN}$) occurs before the main (PN) junction 230, and carrier injection will occur at the P-type region 220 at the anode pad 240 and the sense pad 270 that differs. Put another way, a voltage 295 created by the voltage drop of $R_{SENSE}$ will cause a spatially varying voltage across of the main PN junction 230 (i.e., the main junction will be de-biased).

Figure 2B:
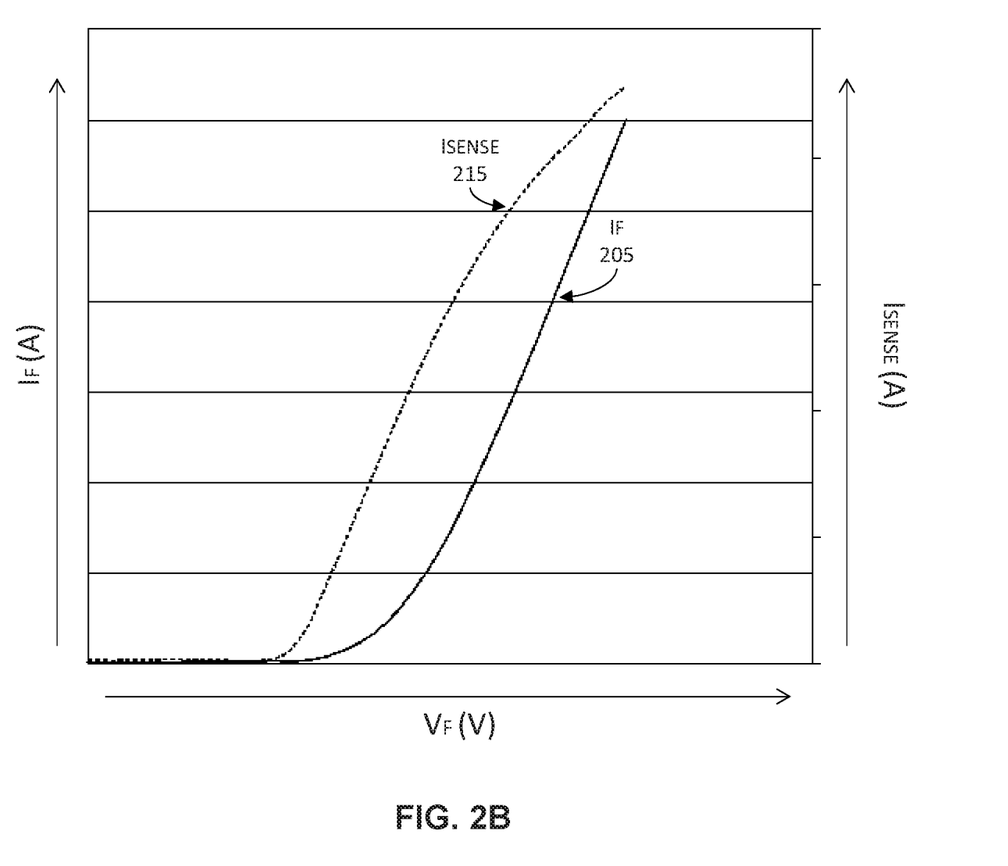
FIG. 2B is a graph of current versus voltage of a sensed current and a forward current for the current sensor configuration of FIG. 2A.

In some implementations, the de-biasing of the main (PN) junction caused by the sense resistor 255 affects the accuracy of $I_{SENSE}$. FIG. 2B is a graph showing the I-V characteristics of a diode with current sensor (e.g., $R_{SENSE}$) configured before the main junction (see FIG. 2A). As can be observed, $I_{SENSE}$ 215 is not linearly related (e.g., proportional) to $I_F$ 205 for the range of forward current. For example, as $V_F$ varies in a range of 0 to 2 volts, $I_F$ may vary from 0 to 350 amps according to the I-V characteristics of the main (PN) junction. The de-biasing is highly dependent on the resistance of $R_{SENSE}$. To reduce the de-biasing in the embodiment of FIG. 2A, the value of $R_{SENSE}$ may be reduced. Accordingly, $I_{SENSE}$ may vary over a range from 0 to 0.025 amps as $I_F$ varies of the range of 0 to 350 amps This approach, however, is practically limited because voltages ($V_{SENSE}$) sensed over small resistance are susceptible to noise (e.g., thermal noise in a circuit to detect $V_{SENSE}$). Additionally, $I_F$ and $I_{SENSE}$ are not related by a constant sense ratio over this range.

In some implementations, the disclosed diode with current sensor of FIG. 1A (i.e. current sensor after the main junction) can have advantages when compared to the embodiment of FIG. 2A (i.e., current sensor before the main junction). The embodiment of FIG. 1A is more accurate over a large operating range and accommodates a wider range of sense ratios (e.g., $R_{SENSE}$). For example, $R_{SENSE}$ may be in a range of about (e.g., within 10% of) 1 ohm to about (e.g., within 10% of) 20 ohms. The practicality of the diode embodiment of FIG. 1A is based on the ease of integrating the sense pad with a standard diode design. Accordingly, an aspect of the present disclosure is integration of the sense pad with features that can be implemented in a power semiconductor diode design. After integration these features become dual-purposed. That is, another aspect of the present disclosure is a power semiconductor diode with features that function with a first purpose when the diode is forward biased and that function with a second purpose when the diode is reverse biased.

Figure 3A:
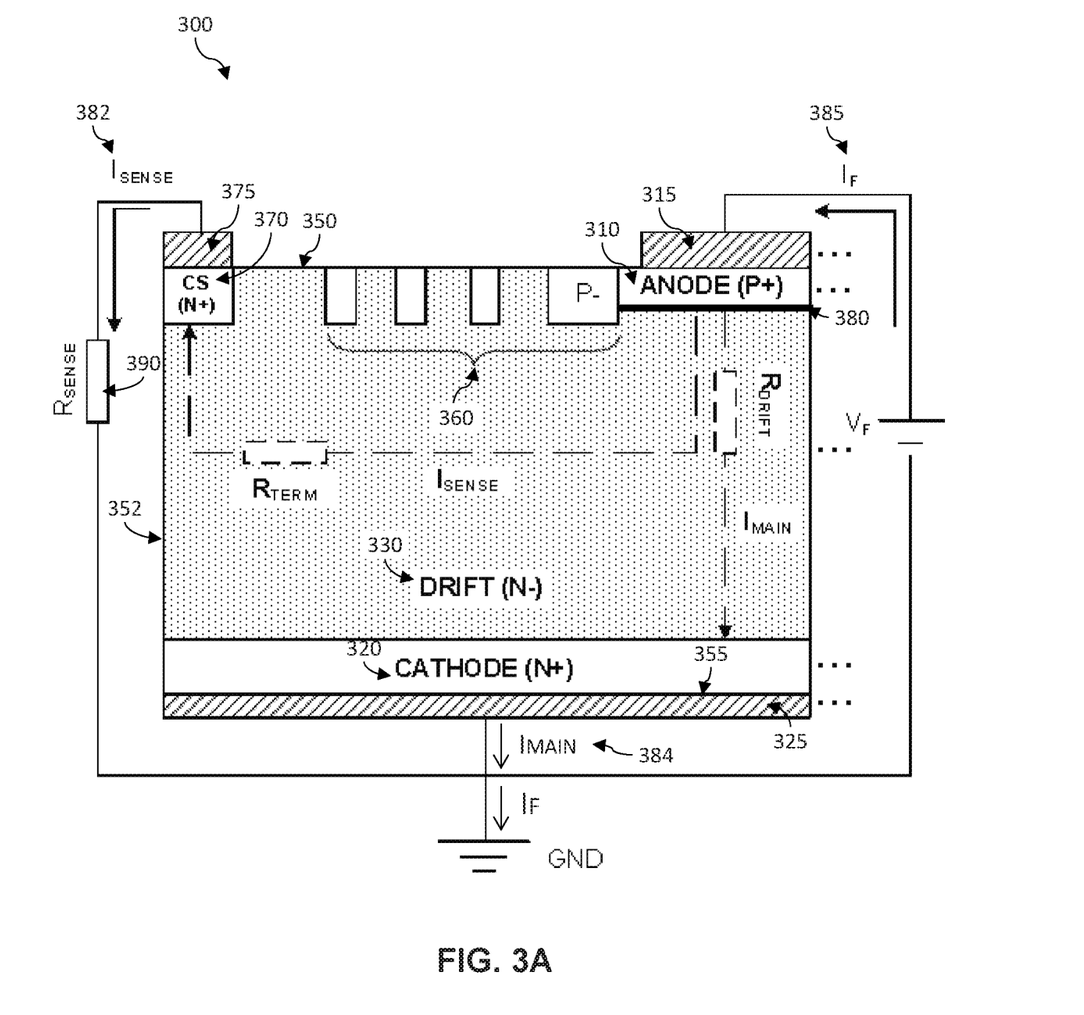
FIG. 3A is a cross-sectional side-view of a power semiconductor diode with a current sensor coupled to a channel-stop pad according to an embodiment of the present disclosure.

FIG. 3A illustrates a cross-sectional side-view of a power semiconductor diode (i.e., diode) with a current sensor according to an embodiment of the present disclosure. The power diode includes a heavily-doped P-type (i.e., P+) anode region 310, a heavily-doped N-type (i.e., N+) cathode region 320, and a lightly-doped N-type (i.e., N−) drift region (i.e., drift layer). The arrangement of the drift region 330 between the anode region 310 and the cathode region 320 balance the requirements of a high break-down voltage and a low forward resistance, which can be desirable or necessary in at least some high-power applications.

The diode 300 also includes lightly-doped P-type (i.e., P−) regions 360 that are located adjacent to a top surface 350 of the diode and arranged (i.e., spaced) along a direction from the anode region 310 to an edge surface 352 of the substrate. These regions are collectively known as an edge termination 360 of the diode. While only one edge surface (i.e., the left edge) is shown in FIG. 3A, the diode can include additional edge surfaces (e.g., four edge surfaces for a rectangular substrate), and the orientation of the edge termination can be the same with respect to each edge surface.

The diode 300 also includes a heavily-doped N-type (i.e., N+) region (other than the cathode region) known as a channel-stop region (i.e., channel stopper, channel stop). The channel-stop region 370 is adjacent to the top surface 350 and the edge surface 352 (i.e., each edge surface of the device).

In some implementations, the edge termination 360 and the channel-stop region 370 function to protect the diode (e.g., from a breakdown condition) when a reverse bias voltage ($V_R$) is applied across the main (PN) junction 380 of the diode. When the diode is reverse biased (i.e., a voltage applied to the cathode region 320 is higher than a voltage applied to the anode region 310), a depletion region forms with in the drift region 330. The depletion region has a size that is proportional to the reverse bias voltage. The edge termination and the channel stopper affect the size/shape of the depletion region so that it does not grow larger than the drift layer (e.g., thickness) and break down the diode (i.e., punch through). The edge termination 360 and the channel stop region 370 have no function when the diode is forward biased (e.g., by $V_F$).

The channel stop region 370 of the diode is similar to the cathode region 320 of the diode (e.g., both are heavily doped N-type regions). Accordingly, an aspect of the present disclosure is the recognition that a channel-stop pad 375 can be disposed on the channel stop region 370 of the diode (i.e., on a portion of the top surface 350 of the diode) to function as the sense pad, which was discussed in reference to FIG. 1A.

As in FIG. 1A, if a forward voltage, $V_F$, is applied between a conductive (e.g., metal) anode pad 315 disposed on a portion of a top surface 350 of the substrate and a cathode pad disposed on (at least a portion of) a bottom surface 355 of the substrate (e.g., $V_F$ applied to anode pad and a ground applied to cathode pad). Then the main (PN) junction 380 of the diode is forward biased and a forward current, $I_F$, will pass through the diode to ground.

As shown in FIG. 3A, after the main (PN) junction 380, the forward current 385 ($I_F$) is divided into two parts. A main current 384 ($I_{MAIN}$) flows through the drift region 330 between the anode region 310 and the cathode region 320, and a sense current 382 ($I_{SENSE}$) flows through the drift region 330 between the anode region 310 and the channel stop region 370. Accordingly, a sense resistor, $R_{SENSE}$, that is attached between a channel-stop pad 375 and a cathode pad 325 (i.e., ground) will conduct (i.e., sample) a portion of the forward current. As described previously, the sense current, $I_{SENSE}$, through $R_{SENSE}$ 390 will be an accurate representation of the forward current, $I_F$, over a large range of operating values because the current division is after the main (PN) junction 380 and because the sensed voltage is between the channel stop and the cathode (and not across the main junction 380). In other words, by utilizing a sense resistor attached between the channel-stop region 370 and the cathode region 32, the main (PN) junction 380 is not de-biased.

The accuracy of the sense current can be illustrated through an equivalent circuit of the diode shown in FIG. 3A. The equivalent circuit is shown, by way of example, in FIG. 3B. The equivalent circuit includes the main (PN) junction 380 that is forward biased by a forward voltage, $V_F$. After the main junction 380, the path of the forward current 385 is divided into two paths. A main current $I_{MAIN}$ 384 flows through the drift region along a first path (i.e., between the anode region and the cathode region) that has an equivalent resistance of $R_{DRIFT}$ 394. A sense current $I_{SENSE}$ 382 flows through the drift region along a second path (i.e., between the anode region and the channel stop region) that has an equivalent resistance of $R_{TERM}$ 392. The sense current, $I_{SENSE}$, 382 is measured using the sense resistor $R_{SENSE}$ which is in series with the $R_{TERM}$ resistance. In some implementations, $R_{DRIFT}$ is much smaller than $R_{TERM}$. For example $R_{DRIFT}$ may be in the range of 0.5-6.0 ohms and $R_{TERM}$ may be in the range of 70-220 ohms. Additionally $R_{SENSE}$ can be much larger to ensure good sensing. Accordingly, the influence of $R_{SENSE}$ on the operation of the PN junction 380 is limited.

Figure 3B:
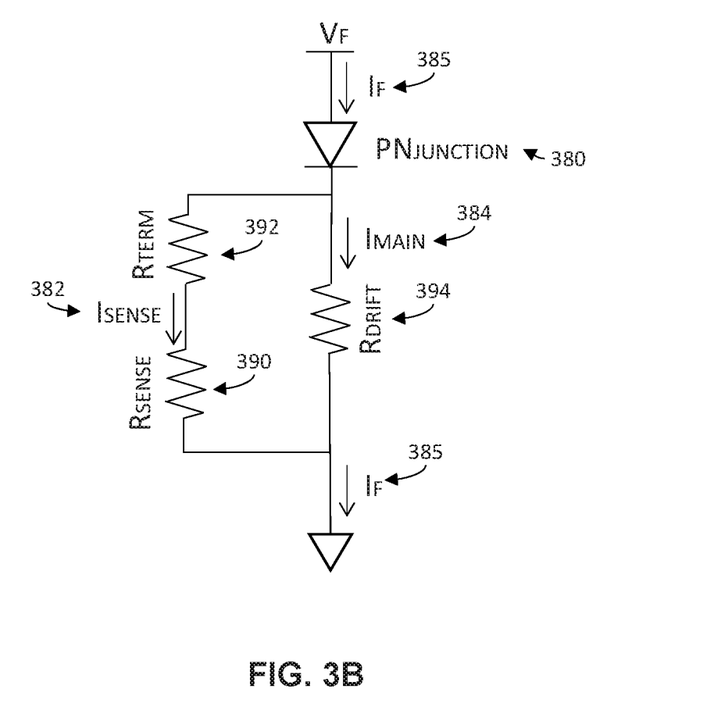
FIG. 3B is a schematic of the equivalent circuit of the power semiconductor diode with a current sensor coupled to a channel-stop pad as shown in FIG. 3A.
Figure 4:
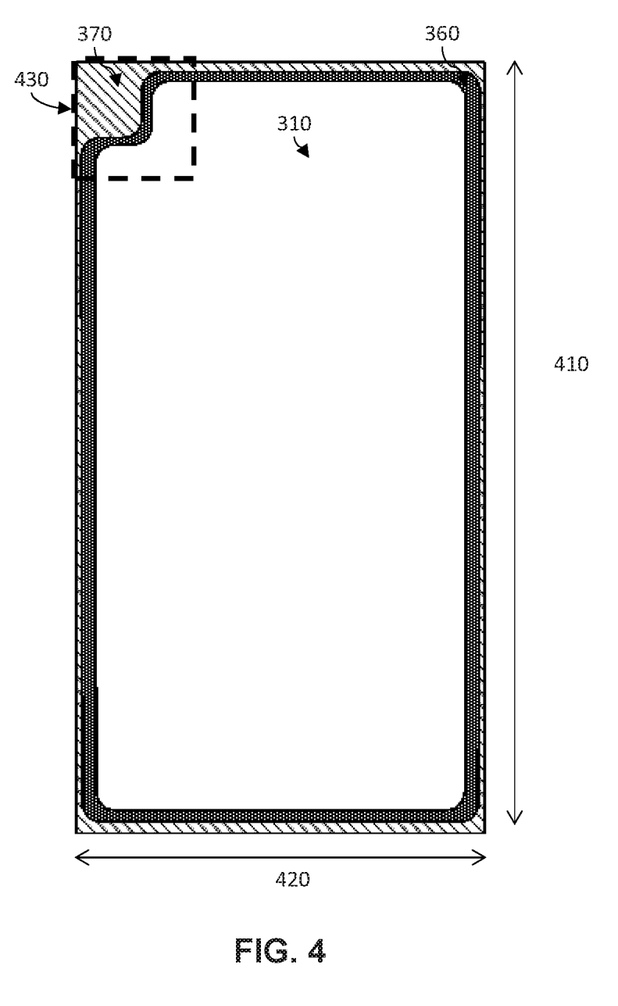
FIG. 4 is a top view of the power semiconductor diode shown in FIG. 3A.

The relationships between the resistances shown in FIG. 3B can be illustrated by the physical design of the diode. A top view of an exemplary power semiconductor diode substrate is illustrated in FIG. 4. The substrate length 410 and width 420 are each larger than the substrate height. As shown, the top of substrate includes an anode region that makes up the majority of the top surface. The anode region 310 is surrounded by an edge termination region 360 that extends around the perimeter of the anode region 310. The edge termination region 360 is surrounded by a channel-stop region 370 that extends to each edge of the substrate. Based on the relative dimensions, current flowing through the anode area will experience a much lower resistance than current flowing through the channel-stop area.

Figure 5:
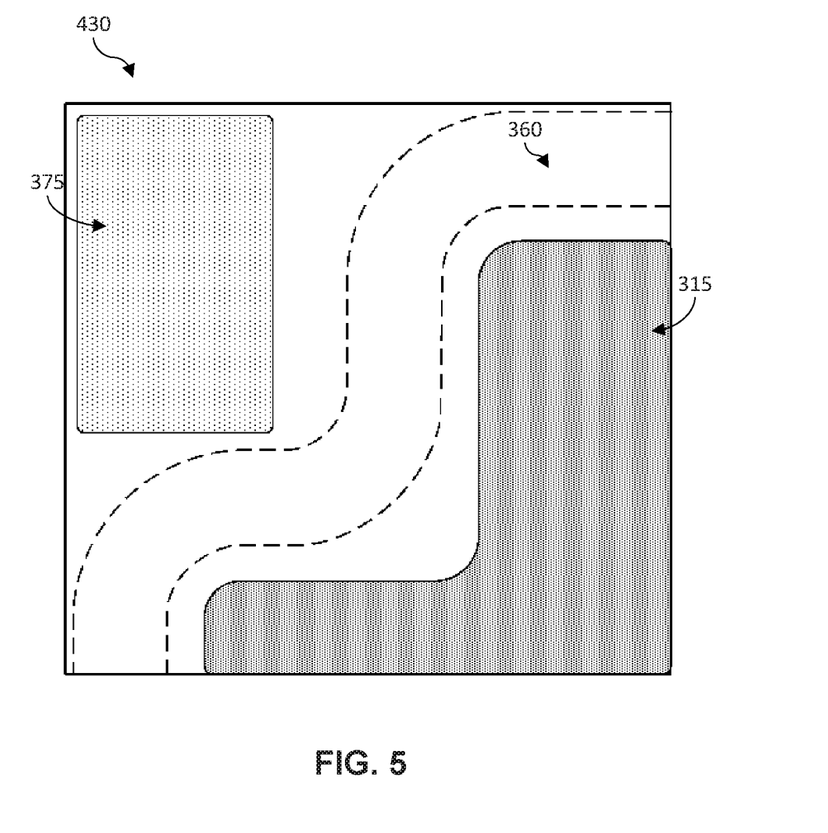
FIG. 5 is a magnified view of a portion of FIG. 4A showing the channel-stop pad and the anode pad.

FIG. 5 is a magnified view of a portion 430 (i.e., dotted box) of FIG. 4A showing the channel-stop pad 375 and the anode pad 315. The anode pad is disposed on a first portion of the top surface contiguous with the anode region of the substrate. The anode pad can cover the entire anode region but may be sized and/or shaped differently than the anode region in some embodiments. For example, the anode pad may be sized smaller than the anode region (e.g., 100 μm smaller at each edge of anode region) to provide a space for wire bonding. The channel-stop pad is disposed on a second portion of the top surface contiguous with the channel-stop region of the substrate. The channel stop region shown in FIG. 5 is shaped to accommodate the channel stop pad. The dimensions of the channel-stop pad may be selected based on packaging considerations. For example, channel-stop pad may accommodate a coupling connection (e.g., wire bonding). The size of the channel-stop pad can depend on the coupling connection. For example, the size channel-stop pad may depend on the size of a wire that is bonded to the pad for coupling. For the disclosed embodiment, a wire of approximately 0.0015 inches (i.e., 1.5 mils) diameter is suitable for coupling the (small) sense current. Based on this diameter, a channel-stop pad of at least 0.04 millimeters× 0.04 millimeters (mm) is suitable for the coupling.

One aspect of the disclosed diode is a channel-stop pad contiguous with or otherwise coupled to a channel-stop region. Accordingly, the channel-stop pad may be disposed on any surface of the diode. For the disclosed embodiment, the channel-stop pad is disposed on the same surface as the anode pad (i.e., top surface) in a position on the periphery of the chip directly over the portion of the substrate doped for the channel stop. Another aspect of the disclosed diode includes a sense resistor connected between the channel-stop pad and a cathode pad. The sense resistor may be connected externally to the substrate of the diode. In other words, the diode and the sense resistor can be discrete elements. In some implementations, the sense resistor and the diode may be formed in or on the same substrate. The channel-stop pad can be directly attached to the sense resistor or may be coupled to the sense resistor a conductive element (e.g., terminal). Disposing the channel-stop pad and attaching $R_{SENSE}$ adds the functionality of current sensing under forward bias without affecting the functionality of breakdown prevention under reverse bias. Thus, the channel-stop region 370 of the diode 300, in some implementations, can function with at least a first purpose (e.g., current sensing) in a first condition (e.g., forward bias) and a second purpose (e.g., punch-through mitigation) in a second operating condition (e.g., reverse bias).

Figure 6:
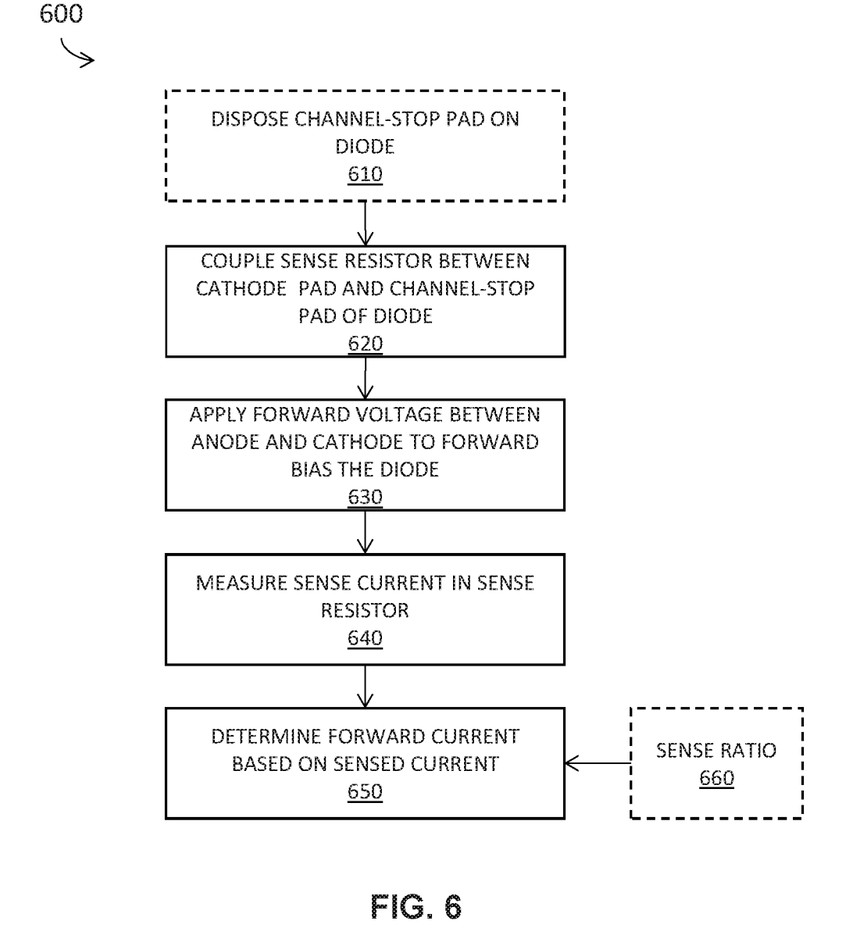
FIG. 6 is a method for determining a forward current through a diode according to an embodiment of the present disclosure.

A flow chart of method 600 for determining a forward current through a diode is shown in FIG. 6. The method can include disposing 610 channel-stop pad to a diode (i.e., to a channel stop region of a diode). A sense resistor is then coupled (e.g., attached) 620 between the channel-stop pad and a cathode pad of the diode. A forward voltage is applied 630 between the anode pad and the cathode pad of the diode to forward bias the diode so that the diode conducts a forward current. Next, the sense current in the sense resistor is measured 640 (e.g., via a voltage across the sense resistor). The measured sense current is proportional to the forward current by a sense ratio 650. Accordingly, the method includes determining 650 (e.g., using the sense ratio) a forward current through the diode based on the measurement of the sensed current.

The disclosed diode with current sensor may be used in a variety of applications. For example, in some applications, it may be desirable to measure the forward current conducted by a diode in the forward bias condition in order to trigger a response to protect a device from damage when a high forward current is detected.

Figure 7:
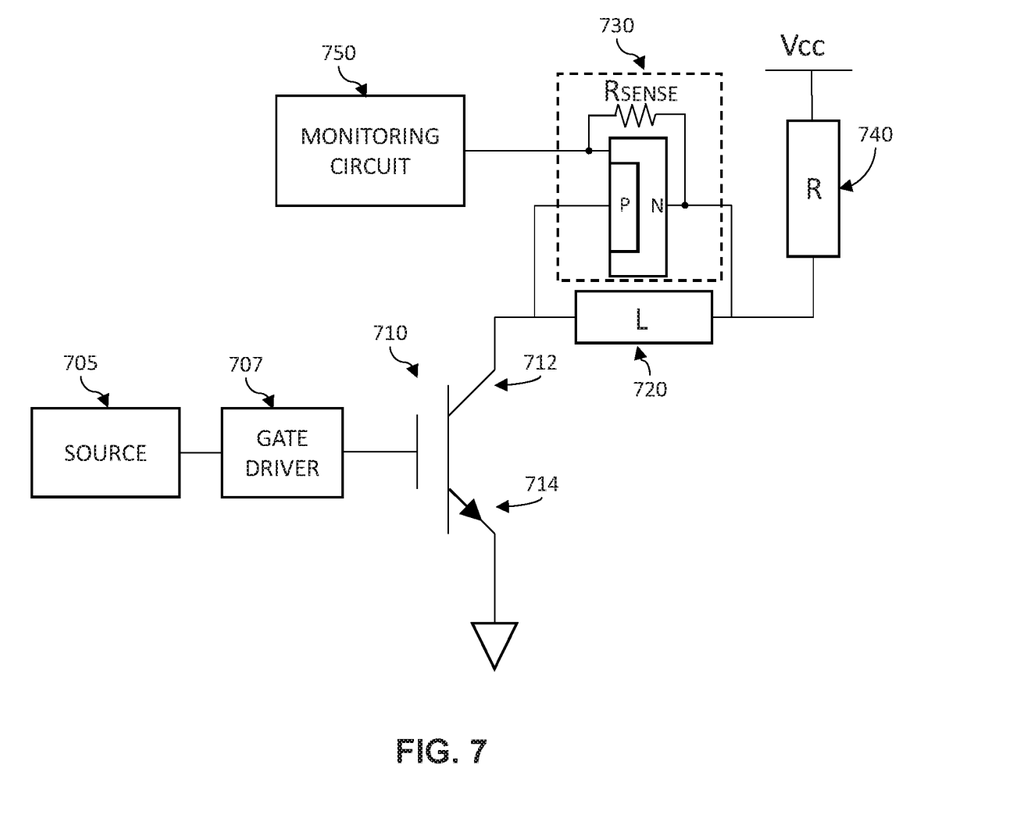
FIG. 7 is a schematic of an example power electronics system that includes a diode of for sensing a circuit condition.

FIG. 7 is a schematic of a power electronics system that includes a diode configured to sense a circuit condition. The circuit includes a switching device 710 (i.e., an insulated gate bipolar transistor, IGBT) configured to be protected from high currents to prevent damage. A source 705 and a gate driver 707 are used to turn the IGBT to an ON state or an OFF state. When in the ON state, the IGBT 710 allows a current to flow between a collector 712 and an emitter 714 of the IGBT, thereby charging an inductor 720. When the IGBT 710 is switched to an OFF state, the energy the inductor 720 a voltage is produced that forward biases (i.e., turns on) a diode 730 with a current sensor. When forward biased, the diode 730 conducts a forward current to discharge the inductor. The diode includes a sense resistor 730 ($R_{SENSE}$) that is attached between a sense pad (e.g., channel-stop pad) and a cathode pad. A portion of the forward current flows through the sense resistor to produce a sense voltage ($V_{SENSE}$) across the sense resistor. A monitoring circuit 750 is receives the voltage across the sense resistor and compare it to a reference voltage ($V_{REF}$). Based on the comparison (e.g., $V_{SENSE} > V_{REF}$), the monitoring circuit may provide an overcurrent fault signal to generate an alert and/or to take an action (e.g., depower the circuit or disconnect a portion of the circuit). Thus, the diode 730 with current sensor may help to monitor fault conditions in order to promote reliability and extend operational life.

The circuit of FIG. 7 is presented as an example. In some implementations, variations to this circuit or new circuits based on the disclosed diode may be devised without departing from the scope of the present disclosure. For example, the switching device is not limited to an IGBT and could be, in possible embodiments, a metal oxide semiconductor field effect transistor (MOSFET) or an electron device, such as an audion. Therefore, it is to be understood that, within the scope of the appended claims, the disclosure may be practiced by those skilled in the art other than as specifically described herein.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The invention claimed is:

1. A diode comprising:
   a substrate;
   a cathode pad disposed on a bottom surface of the substrate;
   an anode pad disposed on a first portion of a top surface of the substrate, the top surface being opposite the bottom surface;
   a channel-stop pad disposed on a second portion of the top surface of the substrate; and
   a sense resistor electrically connected between the channel-stop pad and the cathode pad, the sense resistor configured to conduct a portion of a forward current after the forward current has passed through a main PN junction of the diode.

2. The diode according to claim 1, wherein when the diode is forward biased by a forward voltage between the anode pad and the cathode pad, the portion of the forward current after the forward current has passed through the main PN junction is a sense current that corresponds to the forward current at the anode pad of the diode.

3. The diode according to claim 2, wherein de-biasing a main PN junction of the diode is not induced by the sense resistor connected between the channel-stop pad and the cathode pad.

4. The diode according to claim 2, wherein the sense current is proportional to the forward current by a sense ratio.

5. The diode according to claim 1, wherein the diode is a power semiconductor diode.

6. The diode according to claim 1, wherein the substrate includes:
   a cathode region directly connected to the cathode pad;
   a drift region;
   a channel-stop region directly connected to the channel-stop pad; and
   an anode region directly connected to the anode pad.

7. The diode according to claim 6, wherein when forward biased by a forward voltage between the anode pad and the cathode pad, the diode includes:
   a main current that flows through the drift region between the cathode region and the anode region, and
   a sense current that flows through the drift region between the channel-stop region and the anode region.

8. The diode according to claim 7, wherein a ratio of the forward current and the sense current is in a range of about 100 to 500.

9. The diode according to claim 1, wherein a resistance of the sense resistor is in a range of about 1 ohm to about 20 ohms.

10. A method for determining a forward current through a diode, the method comprising:
    coupling a sense resistor between a cathode pad and a channel-stop pad of the diode;
    applying a forward voltage between an anode pad of the diode and the cathode pad of the diode to forward bias the diode to conduct the forward current through a main junction of the diode;
    measuring a sense current through the sense resistor, the sense current being a portion of the forward current after the forward current has passed through a main junction of the diode; and
    determining a forward current through the diode based on the measurement of the sense current.

11. The method according to claim 10, wherein the cathode pad is on a bottom surface of a substrate, the anode pad is on a first portion of a top surface of the substrate, and the channel-stop pad is on a second portion of the top surface of the substrate.

12. The method according to claim 10, wherein the diode is a power semiconductor diode.

13. The method according to claim 10, wherein the measuring the sense current through the sense resistor includes measuring a sense voltage across the sense resistor and determining a resistance of the sense resistor.

14. The method according to claim 13, wherein the forward voltage at the anode pad is unaffected by the sense voltage across the sense resistor.

15. The method according to claim 10, wherein the determining the forward current through the diode based on the sense current comprises:
    determining the forward current as proportional to the sense current by a sense ratio.

16. The method according to claim 11, wherein the substrate includes:
    a cathode region contiguous to the cathode pad;
    a drift region;
    a channel-stop region contiguous to the channel-stop pad; and
    an anode region contiguous to the anode pad.

17. The method according to claim 16, wherein applying a forward voltage between an anode pad of the diode and the cathode pad of the diode to forward bias the diode causes:
    a main current to flow through the drift region between the cathode region and the anode region, and
    a sense current to flow between the channel-stop region and the anode region.

18. A power electronics system comprising:
    a switching device;
    an inductor coupled to the switching device so that the inductor is charged when the switching device is in an ON state and discharged when the switching device is in an OFF state;
    a diode coupled to the inductor and configured to conduct a forward current when the inductor is discharged, the diode including a sense resistor electrically connected between a cathode pad and a channel-stop pad of the diode; and
    a monitoring circuit coupled to the sense resistor and configured to measure the current discharged through the diode based on a sense voltage across the sense resistor.

19. The power electronics system according to claim 18, wherein the sense resistor is external to a substrate of the diode.

20. A diode comprising:
    a substrate that includes:
        a cathode region to which a cathode pad is directly connected to on a bottom surface of the substrate;
        an anode region to which an anode pad is directly connected to on a first portion of a top surface of the substrate;
        a channel-stop region to which a channel-stop pad is directly connected to on a second portion of the top surface of the substrate; and
        a drift region between the channel-stop region, the cathode region and the anode region; and
    a sense resistor electrically connected between the channel-stop pad and the cathode pad, wherein when the diode is forward biased by a forward voltage between the anode pad and the cathode pad, a main current flows through the drift region between the anode region and the cathode region and a sense current flows through the drift region between the anode region and the channel-stop region.

\* \* \* \* \*